United States Patent [19]

Kamimura et al.

[11] 3,974,455
[45] Aug. 10, 1976

[54] TRANSISTOR AMPLIFIER

[75] Inventors: Kazuhiko Kamimura, Yokohama; Tadao Yoshida, Tokyo, both of Japan

[73] Assignee: Sony Corporation, Tokyo, Japan

[22] Filed: May 15, 1975

[21] Appl. No.: 577,678

[30] Foreign Application Priority Data
May 21, 1974 Japan................................ 49-57004
May 21, 1974 Japan................................ 49-57005

[52] U.S. Cl. ............................... 330/22; 330/13; 330/35; 330/149
[51] Int. Cl.² ............................................ H03F 3/16
[58] Field of Search ............... 330/22, 13, 35, 40, 330/149

[56] References Cited
UNITED STATES PATENTS
3,389,344  6/1968  Fichtner........................ 330/149 X

*Primary Examiner*—James B. Mullins
*Attorney, Agent, or Firm*—Lewis H. Eslinger; Alvin Sinderbrand

[57] ABSTRACT

A transistor amplifier comprising a bipolar transistor having an input electrode and a pair of output electrodes, one of the output electrodes being coupled to the gate electrode of a field effect transistor, the field effect transistor having triode-type dynamic characteristics. Respective sources of operating potential are coupled to the bipolar and field effect transistors. To stabilize the DC bias current flowing through the field effect transistor in the event of fluctuations of the operating potential supplied thereto, a portion of such fluctuations is injected into the other output electrode of the bipolar transistor. The field effect transistor is adapted to drive a load impedance.

29 Claims, 9 Drawing Figures 3,974,455

TRANSISTOR AMPLIFIER

BACKGROUND OF THE INVENTION

This invention relates to a transistor amplifier and, more particularly, to a transistor amplifier comprised of a field effect transistor having triode-type dynamic characteristics wherein the DC bias current flowing therethrough is stabilized, notwithstanding voltage fluctuations in the power supply.

The use of a field effect transistor (FET) having triode-type dynamic characteristics offers many advantages which cannot be obtained from conventional FET's which have pentode-type dynamic characteristics. For example, harmonic distortion is reduced and switching characteristics are improved for the former FET. Also, the FET having triode-type dynamic characteristics has a greatly improved linearity function. Consequently, this type of FET finds ready application in high fidelity audio equipment, especially as an audio output amplifier.

One problem of such an FET having triode-type dynamic characteristics is that the DC bias current which flows through the drain-source circuit will be subjected to variations if the operating potential applied to the FET by the voltage supply exhibits fluctuations. Such bias current variations can result in undesirable distortion in the amplified output of the FET.

One solution to this problem has been proposed in U.S. Pat. application Ser. No. 508,836, filed on Sept. 24, 1974, now U.S. Pat. No. 3,921,089, and assigned to the same assignee as the instant invention. As previously proposed, a bias circuit is connected to the gate electrode of the FET for applying a suitable bias voltage thereto. This bias circuit includes a DC compensating circuit which serves to vary the FET gate bias in response to fluctuations in the operating potential supplied by a power supply. In particular, the change in the gate bias is intended to be directly proportional to the change in operating potential with a proportionality factor related to the amplification constant of the FET.

Although this arrangement offers satisfactory results in most instances, it is desirable to simplify the requisite circuitry. Also, it is preferred to have the change in the gate bias more closely related to the fluctuations in the FET power supply.

OBJECTS OF THE INVENTION

Therefore, it is an object of the present invention to provide an improved transistor amplifier including an FET having triode-type dynamic characteristics wherein the DC bias current flowing through the FET is stabilized, notwithstanding voltage fluctuations in the FET power supply.

Another object of this invention is to provide an improved transistor amplifier of simple construction and including a bias-stabilized FET having triode-type characteristics.

Another object of this invention is to provide an improved amplifier including an FET having triode-type characteristics disposed in drain follower configuration and exhibiting a stabilized DC bias current.

Yet another object of this invention is to provide an improved amplifier including an FET having triode-type characteristics and further including a simple compensating circuit for preventing amplifier output distortion caused by fluctuations in the operating potential applied to the FET.

A still further object of the present invention is to provide a transistor amplifier of relatively simple circuit configuration which is readily adapted for use as a high quality audio power amplifier.

Various other objects and advantages of the present invention will become apparent from the ensuing detailed description, and the novel features will be particularly pointed out in the appended claims.

SUMMARY OF THE INVENTION

In accordance with the present invention, an improved transistor amplifier is provided including a transistor having an input electrode and a pair of output electrodes and an FET having triode-type characteristics, the gate electrode of the FET being connected to one of the transistor output electrodes; the source-drain circuit of the FET is connected to a source of operating potential; and a portion of fluctuations in the operating potential are injected into the other output electrode of the transistor to thereby vary the gate voltage applied to the FET by the transistor in a direction to stabilize the DC bias current flowing through the FET source-drain circuit in the presence of such operating potential fluctuations.

BRIEF DESCRIPTION OF THE DRAWINGS

The following detailed description will best be understood in conjunction with the accompanying drawings in which.

DETAILED DESCRIPTION OF CERTAIN ONES OF THE PREFERRED EMBODIMENTS

Figure 1:
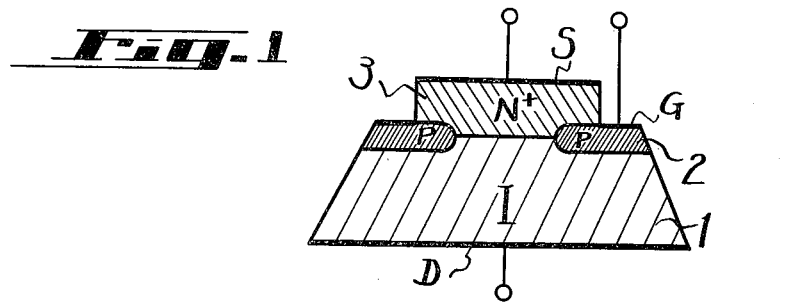
FIG. 1 is a sectional view of one embodiment of a field effect transistor having triode-type characteristics which may be used with the present invention.

Referring to the drawings, and in particular to FIG. 1, there is depicted a sectional view of one example of an FET having triode-type dynamic characteristics which may be used in the transistor amplifier in accordance with this invention. The FET is a vertical junction structure formed of an intrinsic semiconductor region 1 having low impurity concentration and high resistance, a P-type semiconductor region 2 having an annular configuration and formed on the upper portion of the intrinsic region 6, and an N-type semiconductor region 3 having high impurity concentration formed over both the annular P-type region 2 and the intrinsic region 1, as shown. The P-type region 2 may be formed by conventional selective diffusion techniques and the N-type region 3 may be formed by conventional epitaxial techniques. Of course, other methods can be used to form these regions, as desired. Respective drain D, gate G and source S electrodes are provided at the lower surface of the intrinsic region 1, an exposed portion of the P-type annular region 2 and the upper surface of the N-type region 3, respectively.

Figure 2:
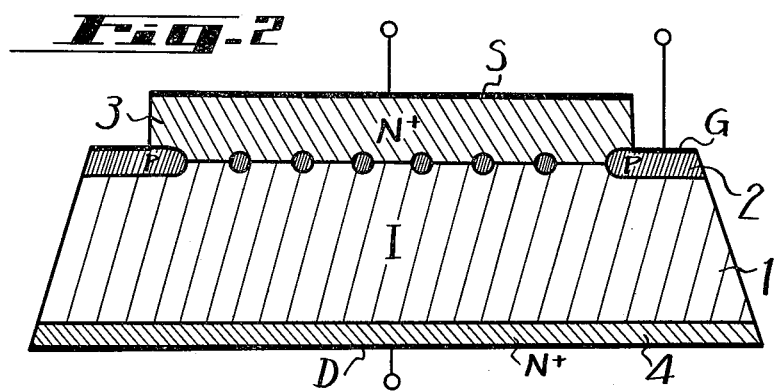
FIG. 2 is a sectional view of another embodiment of a field effect transistor which may be used with the present invention.

The vertical junction FET depicted in FIG. 1 exhibits triode-type dynamic characteristics. A preferred embodiment of such an FET is depicted in FIG. 2 wherein like reference numerals identify corresponding elements. The FIG. 2 embodiment may be thought of as being formed by a combination of plural FET's of the type shown in FIG. 1 and closely resembles the aforedescribed FIG. 1 embodiment of the FET with the added modifications that the P-type annular region 2 is formed with a mesh-type structure therewithin, as shown. Accordingly, the high impurity concentration N-type region 3 is seen to overlie both the annular and mesh-shape P-type region 2 and the intrinsic region 1, the mesh-shape defining a boundary between the intrinsic region and the overlying high impurity concentration N-type region. Furthermore, an additional N-type semiconductor region 4 having high impurity concentration is formed on the lower surface of the intrinsic semiconductor region 1, and the drain electrode D is formed thereon. The additional N-type region serves to increase the breakdown voltage between the drain and source electrodes.

The equivalent internal resistance between the source and drain electrodes is a composite resistance comprised of the resistance between the source electrode and the channel within the FET, the resistance of the channel itself and the resistance between the channel and the drain electrode. In the prior art junction FET the channel is a lateral channel having high resistance because of its narrow and long configuration. The source-to-channel resistance and the channel-to-drain resistance also are high. Consequently, the resistance of the prior art junction FET is very high. As a result of this high resistance, the prior art junction FET exhibits pentode-type dynamic characteristics and, as is apparent therefrom, the drain current becomes saturated as the drain voltage is increased.

In comparison to the aforedescribed prior art junction FET, the FET shown in FIGS. 1 and 2 is characterized by a relatively small separation between the source electrode S and the vertical channel and, additionally, the channel length itself is relatively small so that the ratio of channel width to length is larger than that of the prior art lateral channel FET. Consequently, the output resistance of the vertical junction FET depicted in FIGS. 1 and 2 is much smaller than the resistance of the prior art FET and is on the order of, for example, about 10 ohms. Accordingly, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

Figure 3:
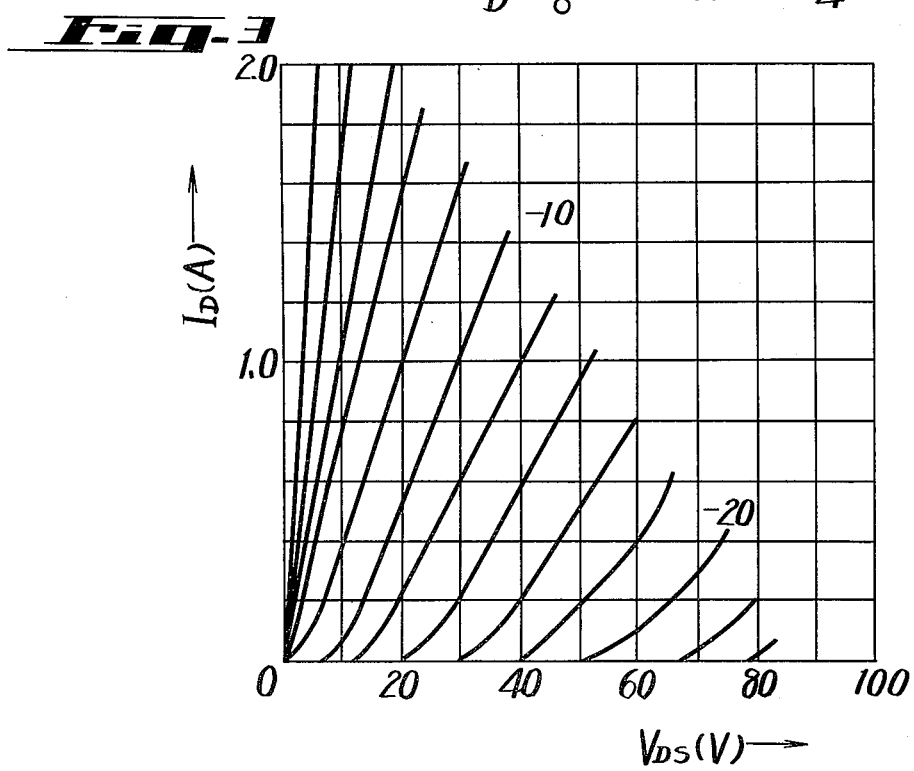
FIG. 3 is a graphical representation illustrating typical dynamic characteristics of a field effect transistor having triode-type characteristics.

An illustration of the dynamic characteristics exhibited by the FET shown in FIGS. 1 and 2 is graphically represented in FIG. 3. This graphical representation depicts the relationship between the drain current $I_d$, in milliamps, and the drain voltage $V_d$ in volts. Each individual curve represents the current-voltage relationship for corresponding gate voltages $V_g$ wherein the gate voltage is the variable parameter from, for example, 0V to −24V. It is recognized that the characteristic curves shown in FIG. 3 are analogous to the curves which represent the dynamic characteristics of a conventional triode. Therefore, because the FET is of the type which exhibits triode-type dynamic characteristics, the output resistance is substantially constant and the FET is capable of producing a large output signal having little distortion.

Among the advantages attained by the use of the illustrated FET having triode-type dynamic characteristics is that the larger ratio of vertical channel width to channel length between the drain and source regions permits a higher drain current to flow. Another advantage is that the characteristic curves depicting the relationship between drain current and gate voltage are linear so that odd harmonic distortion is reduced. Yet another advantage is the reduction in switching distortion which is attributed to the fact that the FET does not have the storage carriers which are included in bipolar transistors. Still another advantage is the high input impedance of the FET. As a result of such input impedance, the load presented by an input source does not cause non-linear distortion. Yet a further advantage lies in the fact that, because of its low output resistance, the illustrated FET can readily drive a load which requires a relatively high damping factor. An additional advantage is that if the illustrated FET is used in a push-pull amplifier, a complementary push-pull circuit can be formed of simple circuit construction.

The conventional lateral junction FET cannot achieve the foregoing advantages, primarily because it exhibits pentode-type dynamic characteristics and thus has a very high output resistance, on the order, for example, of several megohms. Thus, with the conventional FET, as the drain voltage increases, the drain current is driven into saturation at a relatively low value of drain voltage.

Figure 4:
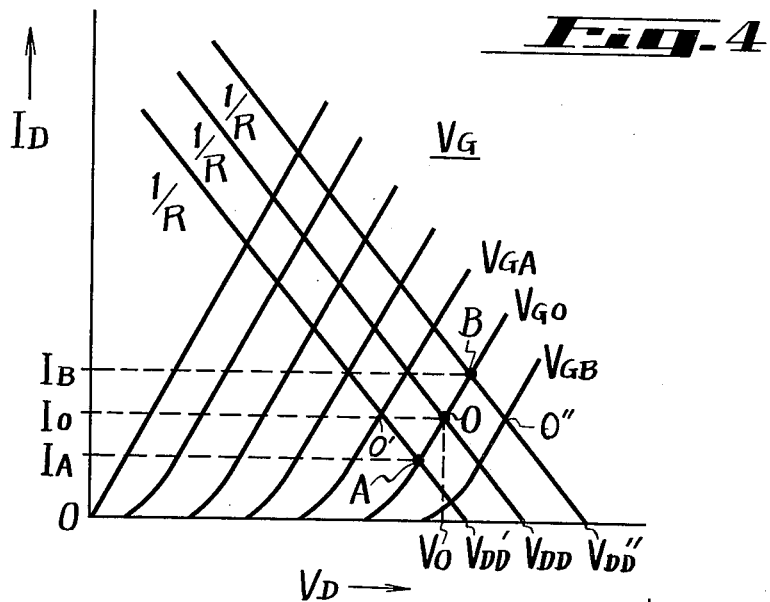
FIG. 4 is a graphical representation of field effect transistor characteristics which will be helpful in understanding the present invention.

The affect of fluctuations in the operating potentials applied to the FET now will be described with reference to FIG. 4. The graphical representation of FIG. 4 depicts the triode-type dynamic characteristics of the FET. In addition, a load line is drawn on these characteristics, the load line having a slope, or inclination, equal to 1/R, where R represents the load impedance. If it is assumed that the operating potential supplied to the FET is equal to $V_{DD}$, then the load line drawn from this point is seen to intersect the current-voltage curve at the point 0 for the case where the FET gate voltage is equal to $V_{G0}$. This point 0 can be considered to be a quiescent, or normal operating point, resulting in a DC bias current equal to $I_0$ at the drain electrode.

Now, if the operating potential supplied to the FET is subjected to a fluctuation so as to be decreased to the value $V'_{DD}$, then the load line will correspondingly shift so as to intersect the abscissa at this lower point. Similarly, if the operating potential supplied to the drain electrode is increased to the higher value $V''_{DD}$, then the load line correspondingly shifts, as shown. In this regard, it is apparent that a negative change in the operating potential causes the load line to intersect the current-voltage characteristic curve for a gate voltage equal to $V_{GO}$ at the point A. This has the effect of reducing the drain bias current from its quiescent value $I_0$ to a lower value $I_A$. Similarly, in response to a positive change in the operating potential supplied to the FET drain electrode, the intersection of the load line with the $V_{GO}$ current-voltage curve now occurs at the point B, resulting in an increased drain bias current $I_B$.

This variation in the drain bias current caused by fluctuations in operating potential supplied to the FET drain electrode has the deleterious affect of producing distortions in the output of the audio amplifier. This disadvantage is accentuated for the amplifier configuration wherein N-channel and P-channel FET's having triode-type dynamic characteristics are used as a complementary push-pull audio amplifier, or in a class-AB amplifier. This can be readily appreciated when it is recognized that, in such an amplifier configuration, the N-channel and P-channel FET's are selected to have current-voltage characteristic curves with respect to the drain electrode which have matched cut-off characteristics.

Figure 5:
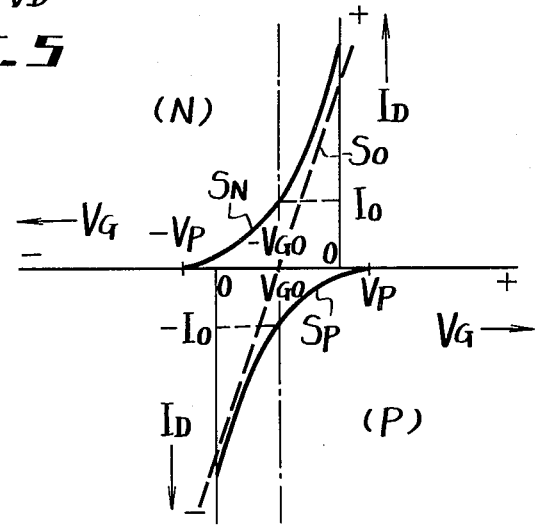
FIG. 5 is another graphical representation of field effect transistor characteristics which will be helpful in understanding the present invention.

The operation derived from matched complementary FET's having triode-type dynamic characteristics is graphically represented in FIG. 5. In this graphical depiction, the full line in the upper half of the graph represents the relationship between the drain current and the gate voltage of the N-channel FET. The full line in the lower half of the graph represents the relationship between the drain current and the gate voltage of the P-channel FET. If the gate voltages applied to the respective FET's are equal to $-V_{GO}$ and $+V_{GO}$, then a composite characteristic curve for the complementary FET's will effectively be as indicated by the broken line $S_0$. However, if the drain bias currents of these FET's are lowered from $I_0$ to $I_A$ as a result of operating potential fluctuations, then a step is formed in the composite characteristic curve $S_0$ at zero drain current. This step results in introduction of crossover distortion in the push-pull amplifier output.

In accordance with the present invention, this problem of variation in the drain bias current of the FET, as well as the problem of crossover distortion in a class-AB push-pull amplifier are avoided by varying the DC bias voltage applied to the FET gate electrode to compensate such operating potential fluctuations. More particularly, the gate electrode bias voltage is applied through a driving transistor, such as bipolar transistor, as a function of the variations in the operating potential. For example, and with respect to the graphical representation of FIG. 4, if the operating potential is subjected to a negative change so as to be decreased to the value $V'_{DD}$ so as to decrease the drain current from $I_0$ to $I_A$, then the gate voltage should be changed from $V_{GO}$ to $V_{GA}$. It is seen that this change in the gate voltage results in the current-voltage characteristic curve associated therewith to intersect the shifted load line at the point 0'. At this operating point, the drain current is seen to be equal to the quiescent level $I_0$. Conversely, if the operating potential is subjected to a positive change so as to be increased to the value $V''_{DD}$, then the gate voltage should be increased to the value $V_{GB}$. It is seen that the current-voltage characteristic curve associated with this increased gate voltage intersects the shifted load line at the point 0''. At this operating point, the drain bias current is equal to $I_0$.

Therefore, it is appreciated that the present invention proceeds upon the principle of varying the FET gate voltage as a function of fluctuations in the FET operating potential so as to maintain the quiescent drain bias current notwithstanding such fluctuations. Hence, the FET bias current is stabilized.

Figure 6:
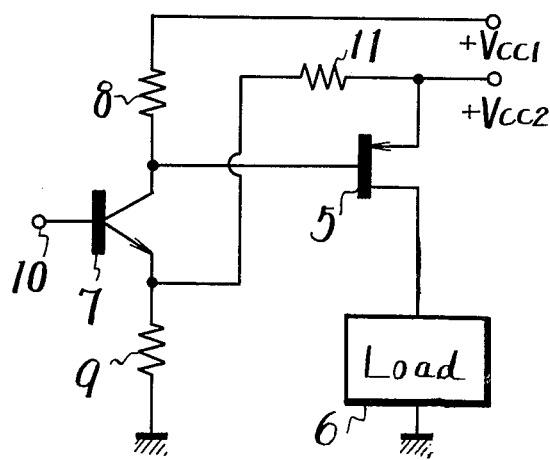
FIG. 6 is a schematic diagram of one embodiment of a transistor amplifier in accordance with the teachings of this invention.

One embodiment of a transistor amplifier which is capable of carrying out the principles of this invention is schematically illustrated in FIG. 6. This embodiment of the amplifier is comprised of an FET 5 having triode-type dynamic characteristics and a transistor, such as a bipolar transistor, 7. As shown, the source and drain electrodes of the FET 5 are connected through a load impedance 6 across a source of operating potential $+V_{CC2}$. In the illustrated circuit, one terminal of the operating potential source is assumed to be connected to a reference potential, such as ground.

The gate electrode of the FET 5 is coupled to one of the output electrodes, for example, the collector electrode, of the transistor 7. The other output electrode of the transistor is adapted to receive a portion of the fluctuations of the source of operating potential $+V_{CC2}$. Accordingly, as shown, a voltage divider circuit formed of the series-connected resistors 11 and 9 is connected across the source of operating potential $+V_{CC2}$, and the output of this voltage divider circuit, formed by the junction of the resistors, is connected to the emitter electrode of the transistor 7. The collector electrode of the transistor is connected through a collector load resistor 8 to another source of operating potential $+V_{CC1}$. The base electrode of the transistor functions as an input, or control, electrode and is coupled to an input terminal 10 for receiving an input signal to be amplified. In one example of the illustrated embodiment, the source of operating potential $+V_{CC1}$ is selected to produce a higher potential than the source of operating potential $+V_{CC2}$. Accordingly, the gate-source voltage of the FET 5 is of positive polarity.

In operation, the gain of the transistor 7 can be approximated by the ratio between the collector resistor 8 and the emitter resistor 9. An input signal applied to the input terminal 10 is amplified by the transistor 7 by an amplification ratio equal to the aforenoted transistor gain. This amplified output signal is supplied to the FET gate electrode and is further amplified by the amplification constant of the FET to drive the load 6.

The effect of voltage fluctuations in the operating potential supplied to the FET by the source of operating potential $+V_{CC2}$ has been shown and described hereinabove with respect to FIG. 4. For the application wherein the FET is used as the output stage in an audio amplifier for driving a loudspeaker system, it is typical for the voltage fluctuations in the source $+V_{CC2}$ to be greater than the fluctuations in the source $+V_{CC1}$. If it is assumed that the voltage produced by the source of operating potential $+V_{CC2}$ is increased by an amount $\Delta V_{CC}$, then it is appreciated that the drain current flowing through the FET 5 will correspondingly increase by an amount $\Delta I_d$. This relationship between the change in the voltage source and the resultant change in the drain bias current has been described previously with reference to FIG. 4. Conversely, a decrease in the voltage produced by the source of operating potential $+V_{CC2}$ produces a corresponding decrease in the drain bias current of the FET 5. It is recognized that this fluctuation in the drain bias current produces an undesirable distortion in the output signal supplied by the FET to the load 6.

By the present invention, a change in the gate voltage $\Delta V_G$ is applied to the FET gate electrode in response to a change $\Delta V_{CC}$ in the source of operating potential +V$_{CC2}$ so as to stabilize the drain bias current of the FET in the manner previously described with reference to FIG. 4. This change in the gate voltage is derived by injecting the voltage source fluctuation ΔV$_{CC}$ into the emitter electrode of the transistor 7. It is appreciated that if ΔV$_{CC}$ is positive, then the base-emitter potential applied to the transistor 7 is decreased. This effective decrease in the input signal applied to the terminal 10 is amplified by the transistor with the gain determined by the ratio of the resistance values of the resistors 8 and 9. It is recognized that the resultant amplification will increase the gate voltage applied to the FET by the collector electrode of the transistor 7 by an amount +ΔV$_G$. It is recalled from FIG. 4, that the increase in the gate voltage tends to restore the drain bias current to its desired value I$_0$.

A mathematical analysis of the foregoing description now is provided. If the resistance values of the resistors 8, 9 and 11 are represented as $r_8$, $r_9$ and $r_{11}$ then, by voltage division, it is seen that a change in the voltage source ΔV$_{CC}$ in the source of operating potential +V$_{CC2}$ is applied to the emitter electrode of the transistor 7 as $r_9 \Delta V_{CC}/(r_{11}+r_9)$. This causes a change in the input signal level applied to the transistor 7 which is amplified by the factor $r_8/r_9$ so as to produce a change in the FET gate voltage which can be expressed as:

$$\Delta V_G = \frac{r_9}{r_{11}+r_9} \cdot \frac{r_8}{r_9} \Delta V_{CC} \quad (1)$$

In general, the resistance of the resistor 11 is selected to be much larger than the resistance of the resistor 9 so that equation (1) can be reduced to be practically represented as:

$$\frac{\Delta V_G}{\Delta V_{CC}} \doteq \frac{r_8}{r_{11}} \quad (2)$$

wherein the sign $\doteq$ is defined as, "substantially equal to" or "closely approximate to", wherein the difference between the terms on either side of this sign is negligible.

The FET 5 has an amplification constant μ which defines the relationship between the gate and source voltages of the FET. More particularly, for the embodiment depicted in FIG. 6 wherein the FET 5 is in grounded source configuration, the relationship between a change in the gate voltage ΔV$_G$ and a change in the source voltage ΔV$_S$, the latter being equal to the fluctuation ΔV$_{CC}$ in the source of operating potential +V$_{CC2}$, can be expressed as:

$$\frac{\Delta V_G}{\Delta V_S} = \frac{\Delta V_G}{\Delta V_{CC}} = 1 + \frac{1}{\mu} \quad (3)$$

If equations (2) and (3) are combined, the following expression results:

$$\frac{r_8}{r_{11}} \doteq 1 + \frac{1}{\mu} \quad (4)$$

It is seen that if the resistance values $r_8$ and $r_{11}$ are selected to satisfy the relationship defined by equation (4), then the drain bias current of the FET 5 will be stabilized at its substantially constant operating level, for example, I$_0$, notwithstanding fluctuations in the source of operating potential +V$_{CC2}$. That is, by so dimensioning the resistors R$_8$ and R$_{11}$, a fluctuation in the source of operating potential will result in a corresponding change in the gate voltage applied to the FET by the transistor 7 which, in turn, will cause the FET drain bias current to be suitably altered in a direction and by an amount which compensates the expected bias current change due to the voltage fluctuation.

Figure 7:
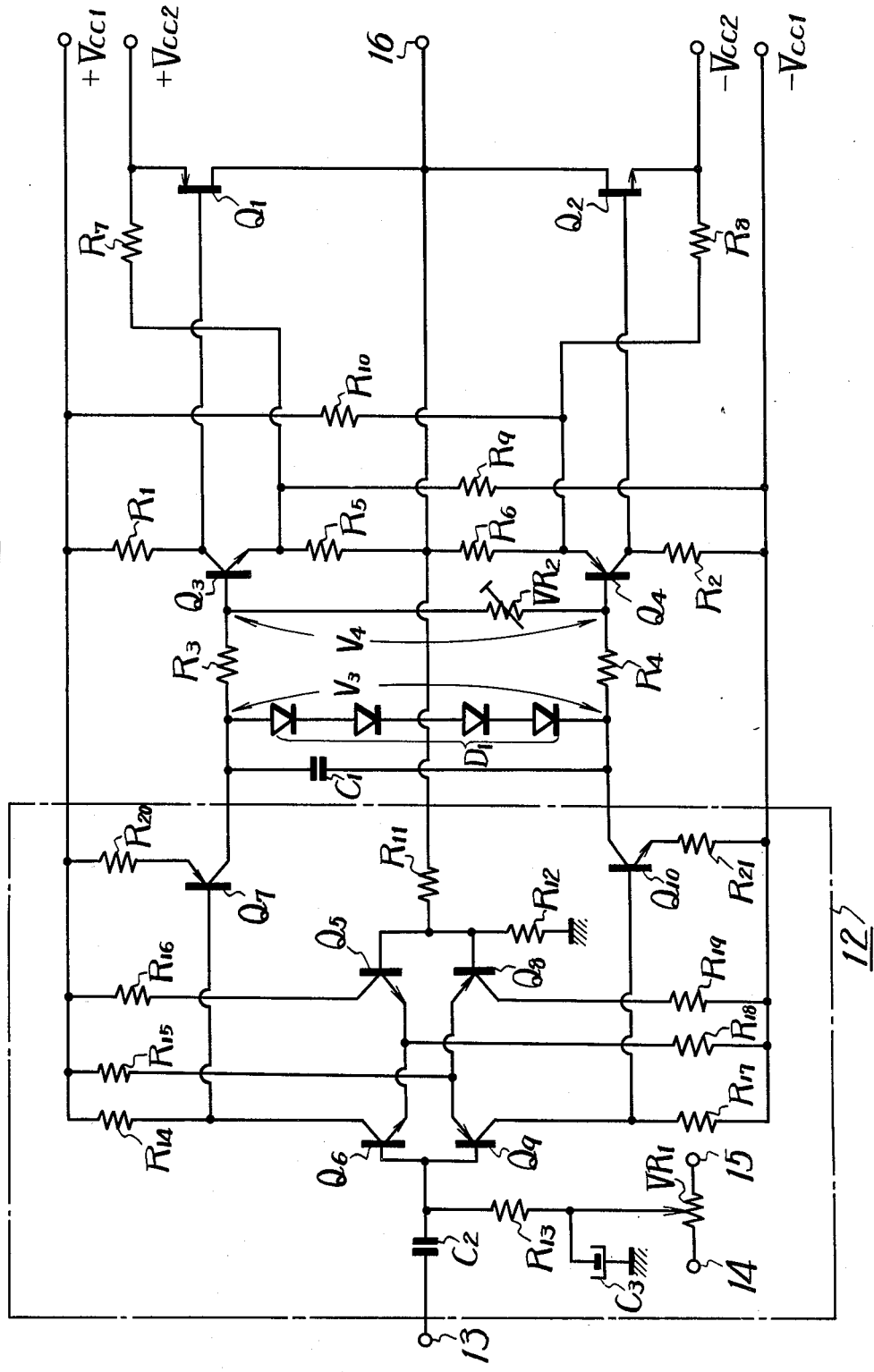
FIG. 7 is a schematic diagram of another embodiment of a transistor amplifier in accordance with the teachings of the present invention.

Referring now to FIG. 7, a class-B or -AB push-pull amplifier incorporating the embodiments of the present invention previously described with reference to FIG. 6 is illustrated. The push-pull amplifier is driven by a class-A amplifier stage 12 having an input terminal 13 which is adapted to be supplied with an input signal to be amplified. The class-A amplifier comprises a first differential amplifier formed by differentially-connected transistors Q$_6$ and Q$_5$ having their respective collector electrodes connected through resistors R$_{14}$ and R$_{16}$ to one terminal of a voltage source +V$_{CC1}$. As shown, these transistors have their emitter electrodes connected in common and through a resistor R$_{18}$ to a terminal of a voltage source −V$_{CC1}$. It is appreciated that the voltage source terminals may be the positive and negative terminals of a DC supply.

The input to the differential amplifier comprising the transistors Q$_6$ and Q$_5$ is supplied from the input terminal 13 through a coupling capacitor C$_2$ to the base electrode of the transistor Q$_6$. As will soon be described, the base electrode of the transistor Q$_5$ is adapted to receive a negative feedback voltage from the push-pull amplifier output.

The amplifier stage 12 is further comprised of another differential amplifier formed by the differentially connected transistors Q$_9$ and Q$_8$ having their respective collector electrodes coupled through resistors R$_{17}$ and R$_{19}$ to the voltage source terminal −V$_{CC1}$. The emitter electrodes of these transistors are connected in common through a resistor R$_{15}$ to the terminal of the voltage source +V$_{CC1}$. As illustrated, the base electrode of the transistor Q$_9$ is connected in common with the base electrode of the transistor Q$_6$ so as to receive the input signal applied to the terminal 13. Also, the base electrode of the transistor Q$_8$ is connected in common to the base electrode of the transistor Q$_5$ so as to receive the negative feedback from the push-pull amplifier output.

An input bias circuit having variable input impedance is connected to the common-connected base electrodes of the transistors Q$_6$ and Q$_9$. This bias circuit comprises a resistor R$_{13}$ connected in series with a capacitor C$_3$ and extends from the transistor base electrodes to a reference potential, such as ground. The junction defined by the resistor R$_{13}$ and the capacitor C$_3$ is connected to the adjustable contact, or tap, of a variable resistor VR$_1$, which may be a potentiometer. A suitable DC voltage is applied to the terminals 14 and 15 across the variable resistor VR$_1$ to thus form a variable bias source for the differential amplifiers.

The output of the differential amplifier formed of the transistors Q$_5$ and Q$_6$ is derived from the collector electrode of the latter transistor and is supplied through an amplifying transistor Q$_7$ to the push-pull output amplifier. The transistor Q$_7$ is complementary to the differentially-connected transistors Q$_5$ and Q$_6$ and has its emitter electrode connected through a resistor R$_{20}$ to the terminal of the voltage source +V$_{CC1}$. Similarly, the output of the differential amplifier formed of the transistors Q$_8$ and Q$_9$ is derived from the collector electrode of the latter transistor and is coupled through an amplifying transistor $Q_{10}$ to the push-pull output amplifier. The transistor $Q_{10}$ is of a conductivity type which is complementary to the differentially-connected transistors, and its emitter electrode is connected through a resistor $R_{21}$ to the terminal of the voltage source $-V_{CC1}$.

A string of series-connected diodes $D_1$ interconnects the collector electrodes of the transistors $Q_7$ and $Q_{10}$ and is adapted to provide a reference voltage $V_3$ thereacross. These diodes are poled such that they are conductive when the collector voltage of the transistor $Q_7$ exceeds the collector voltage of the transistor $Q_{10}$. A capacitor $C_1$ is connected in parallel with the diodes $D_1$ to provide an AC bypass between the transistors $Q_7$ and $Q_{10}$.

A resistor $R_3$ serves to couple the collector electrode of the transistor $Q_7$ to the base electrode of a transistor $Q_3$, the latter transistor serving as an input stage for the push-pull output amplifier. Similarly, a resistor $R_4$ serves to couple the collector electrode of the transistor $Q_{10}$ to the base electrode of the transistor $Q_4$, the latter transistor being complementary to the transistor $Q_3$ and serving as a complementary input stage to the push-pull output amplifier. A variable resistor $VR_2$, such as a potentiometer, rheostat, or the like, interconnects the respective base electrodes of the transistors $Q_3$ and $Q_4$ and, as will soon be described, permits an adjustment to the input bias potentials supplied to the push-pull amplifier.

The push-pull output amplifier is seen to be a power amplifier having complementary stages disposed in push-pull configuration. Each of these stages is similar to the embodiment of the transistor amplifier of this invention which has been described previously with respect to FIG. 6. Thus, the output of one complementary stage is comprised of the FET $Q_1$ having triode-type dynamic characteristics and connected to an output terminal 16 in common-source configuration. The output of the other complementary stage is comprised of the FET $Q_2$ having triode-type dynamic characteristics and connected to the output terminal 16 in common-source configuration. It is appreciated that the FET's $Q_1$ and $Q_2$ are complementary. As in the FIG. 6 embodiment, the FET $Q_1$ is, for example, of the P-channel type having its source electrode connected to the source of operating potential $+V_{CC2}$. The gate electrode of this FET is coupled to the collector electrode of the transistor $Q_3$ which is of a complementary conductivity type. The collector electrode of the transistor $Q_3$ is further connected through a resistor $R_1$ to the terminal of voltage source $+V_{CC1}$ and the emitter electrode of the transistor is connected through a resistor $R_5$ to the output terminal 16. Fluctuations in the source of operating potential $+V_{CC2}$ are injected into the emitter electrode of the transistor $Q_3$ by a resistor $R_7$.

The complementary stage of the push-pull amplifier is similarly connected, whereby the collector electrode of the transistor $Q_4$ is coupled to the gate electrode of the FET $Q_2$ and is further connected through the resistor $R_2$ to the terminal of voltage source $-V_{CC1}$. As shown, the emitter electrode of the transistor $Q_4$ is connected through a resistor $R_6$ to an output terminal 16 and is adapted to receive fluctuations in the source of operating potential $-V_{CC2}$ which are injected thereinto by a resistor $R_8$.

Although not shown, it should be fully appreciated that a load impedance is adapted to be connected to the output terminal 16 to be driven by the illustrated amplifier. Typically, for the application wherein the amplifier is used as a high quality audio amplifier, a loudspeaker system may be connected to the output terminal.

The output voltage supplied to the output terminal 16 by the push-pull amplifier is fed back to the amplifier stage 12 by a negative feedback circuit formed of the series-connected resistors $R_{11}$ and $R_{12}$. These resistors are disposed in voltage divider configuration whose output terminal is defined by the junction formed therebetween. As illustrated, the output of this voltage divider circuit is supplied in common to the transistors $Q_5$ and $Q_8$ of the aforedescribed differential amplifiers.

In the illustrated amplifier, it is appreciated that fluctuations in the voltage source $+V_{CC1}$ and/or $-V_{CC1}$ will affect the respective gate voltages applied to the FET's $Q_1$ and $Q_2$ by the transistors $Q_3$ and $Q_4$, respectively. Although such fluctuations can be minimized and effectively avoided by designing these voltage sources as highly accurate constant regulated sources, such voltage sources are quite expensive and complex. Accordingly, to minimize the cost of such voltage sources, the expected fluctuations thereof are taken into account and their effects are compensated by providing the resistors $R_9$ and $R_{10}$ which serve to inject the fluctuations in the voltage source $-V_{CC1}$ into the emitter electrode of the transistor $Q_3$ and to inject the fluctuations in the voltage source $+V_{CC1}$ into the emitter electrode of the transistor $Q_4$.

The operation of the illustrated amplifier now will be described, initially assuming that no input signal is applied to the input terminal 13. Let it be further assumed that the input bias voltage supplied to the push-pull amplifier by the transistors $Q_7$ and $Q_{10}$ of the amplifier stage 12 results in a voltage $V_3$ across the diodes $D_1$ which is substantially equal to the sum of the diode voltage drops. The resistors $R_3$, $VR_2$ and $R_4$ form a voltage divider circuit connected across the diodes $D_1$ resulting in a divided voltage equal to $V_4$ across the variable resistor $VR_2$. This voltage $V_4$ is sufficient to bias the transistors $Q_3$ and $Q_4$ into conduction such that substantially equal currents flow therethrough and the transistors exhibit a base-emitter voltage drop equal to $V_{BE}$. Assuming negligible base current, it is seen that the collector currents of these respective transistors are equal to the emitter currents thereof which can be expressed as $$I = \frac{V_4 - 2V_{BE}}{R_5 + R_6}$$

Since the bias voltage $V_4$ is a divided fraction of the voltage $V_3$, it is recognized that $V_4$, and thus the collector currents of the transistors $Q_3$ and $Q_4$, can be readily adjusted merely by adjusting the variable resistor $VR_2$. Therefore, since the respective gate voltages applied to the FET's $Q_1$ and $Q_2$ are equal to the collector voltages of the transistors $Q_3$ and $Q_4$, it is appreciated that the operating points of the FET's can be established for class-B or class-AB operation by suitable adjustment of the transistor collector currents in the manner just described.

The distortion which would otherwise be introduced into the amplified output signal provided at the output terminal 16 after amplification of an input signal applied to the input terminal 13 by reason of fluctuations in the sources of operating potential $+V_{CC2}$ and $-V_{CC2}$ are avoided in the manner now to be described. For the purpose of this discussion, let it be assumed that the voltage sources $+V_{CC1}$ and $-V_{CC1}$ are maintained substantially constant and are not subjected to fluctuations. In that event, it is recognized that the drain bias current of the FET's $Q_1$ and $Q_2$ are stabilized in accordance with the configuration shown herein and previously described with respect to FIG. 6. More particularly, if the resistors $R_1$, $R_2$, $R_7$ and $R_8$ have the resistance values $r_1$, $r_2$, $r_7$ and $r_8$, respectively, and if the amplification constants of the FET's $Q_1$ and $Q_2$ are equal to $\mu_1$ and $\mu_2$, respectively, then drain bias current stabilization is achieved, notwithstanding fluctuations in the sources of of operating potential $+V_{CC2}$ and $-V_{CC2}$ if the following equations are satisfied:

$$\frac{r_1}{r_7} \stackrel{.}{=} 1 + \frac{1}{\mu_1} \quad (5)$$

$$\frac{r_2}{r_8} \stackrel{.}{=} 1 + \frac{1}{\mu_2} \quad (6)$$

Let it now be assumed that the voltage sources $+V_{CC1}$ and $-V_{CC1}$ are subjected to fluctuations. Let it be further assumed that the positive and negative voltage sources will experience fluctuations in the same polarity and the same magnitude. Accordingly, with respect to the collector voltage of the transistor $Q_3$ (which is, of course, the gate voltage applied to the FET $Q_1$), a change $\Delta V_{CC1}$ in the voltage source $+V_{CC1}$ will be applied to the transistor collector electrode and an equal change $\Delta V_{CC1}$ in the voltage source $-V_{CC1}$ will be voltage divided by the resistors $R_9$ and $R_5$ and applied to the transistor emitter electrode to thus decrease the base-emitter voltage, this decrease in voltage being amplified by the transistor and provided at the collector electrode in accordance with the transistor gain which is determined by the ratio between the collector and emitter resistances. Thus, the change in the collector voltage of the transistor $Q_3$ is equal to the change in the gate voltage applied to the FET $Q_1$ and may be expressed as:

$$\Delta V G_1 = +\Delta V_{CC1} - \Delta V_{CC1} \cdot \frac{r_5}{r_9 + r_5} \cdot \frac{r_1}{r_5} \quad (7)$$

It is seen that the first expression in equation (7) is attributed to the fluctuation in the voltage source $+V_{CC1}$ and the second expression is attributed to the fluctuation in the voltage source $-V_{CC1}$. If the resistance value $R_9$ is much larger than the resistance value $R_5$, then equation (7) can be reduced to:

$$V G_1 = +\Delta V_{CC1} - \Delta V_{CC1} \cdot \frac{r_1}{r_9} \quad (8)$$

In accordance with equation (8), the change in gate voltage of the FET $Q_1$ due to voltage fluctuations in the voltage sources $+V_{CC1}$ and $-V_{CC1}$ can be avoided if the resistance values $r_1$ and $r_9$ are selected to be substantially equal.

Equations (7) and (8) are equally applicable in determining the change in gate voltage applied to the FET $Q_2$ caused by fluctuations in the voltage sources $+V_{CC1}$ and $-V_{CC1}$. Thus, it follows that such voltage fluctuations will have substantially no affect upon the drain bias current of the FET $Q_2$ if the resistance values $r_2$ and $r_{10}$ are selected to be substantially equal.

Now, if an input signal to be amplified is applied to the input terminal 13, this signal is amplified by the amplifier stage 12 and then is supplied by the transistors $Q_7$ and $Q_{10}$ to the push-pull output amplifier stage. Further amplification is effected by the transistors $Q_3$ and $Q_4$ which drive the FET's $Q_1$ and $Q_2$. It is appreciated that the FET's now can drive a suitable load connected to the terminal 16 with minimal distortion, notwithstanding fluctuations in the voltage sources $+V_{CC1}$ and $-V_{CC1}$ or fluctuations in the sources of operating potential $+V_{CC2}$ and $-V_{CC2}$.

In the illustrated embodiment, it is appreciated that each of the voltage sources and sources of operating potential may be comprised of individual energizing sources. Alternatively, a single voltage source having positive and negative output terminals and a center tap connected to ground may be used to supply the voltages $+V_{CC1}$ and $-V_{CC1}$; and, similarly, a single source of operating potential having positive and negative output terminals and a center tap connected to ground may be used to supply the operating potentials $+V_{CC2}$ and $-V_{CC2}$. It is recognized that the particular configuration of such voltage source and source of operating potential may be selected as desired.

Figure 8:
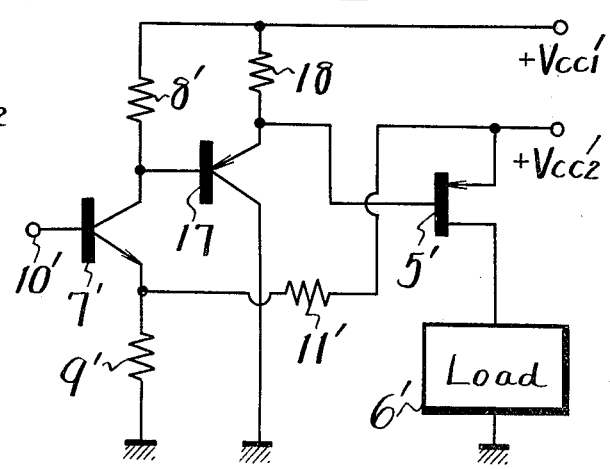
FIG. 8 is a schematic diagram of a still further embodiment of a transistor amplifier in accordance with the teachings of the present invention.

Another embodiment of a transistor amplifier which is capable of carrying out the principles of this invention is schematically illustrated in FIG. 8. This embodiment is similar to the previously described embodiment shown in FIG. 6 and like component parts are identified with corresponding reference numerals having an additional prime. The FIG. 8 embodiment differs fromm the FIG. 6 embodiment in that the collector electrode of the transistor 7' is coupled to the gate electrode of the FET 5' by an emitter follower 17. Thus, as shown, the emitter electrode of the emitter follower transistor 17 is connected through a resistor 18 to the voltage source terminal $+V'_{CC1}$ and the collector electrode of this transistor is connected to ground. The collector output of the transistor 7' is connected to the base electrode of the emitter follower transistor 17.

The operation of the embodiment schematically illustrated in FIG. 8 is substantially similar to the operation of the transistor amplifier previously described with reference to FIG. 6. Thus, the FET 5' having triode-type dynamic characteristics is driven by the emitter follower transistor 17, thereby affording the transistor amplifier a more improved frequency response characteristic. Thus, the higher frequencies of the amplified output signal are not deteriorated, even in the presence of inherent input capacitance of the FET 5'. The addition of the emitter follower is advantageous for those embodiments wherein the FET having triode-type dynamic characteristics exhibits a relatively large capacitance between its gate and source electrodes. Such capacitance can be on the order of several hundred picofarads. It is apparent that, with this magnitude of capacitance, the low output impedance of the emitter follower transistor avoids significant frequency response deterioration of the amplified signal attributed to the FET gate-source capacitance.

In the FIG. 8 embodiment, the transistor 7' and the emitter follower transistor 17 are complementary. However, such complementary transistors are not absolutely necessary, as will become apparent from the following description of the embodiment schematically illustrated in FIG. 9.

Figure 9:
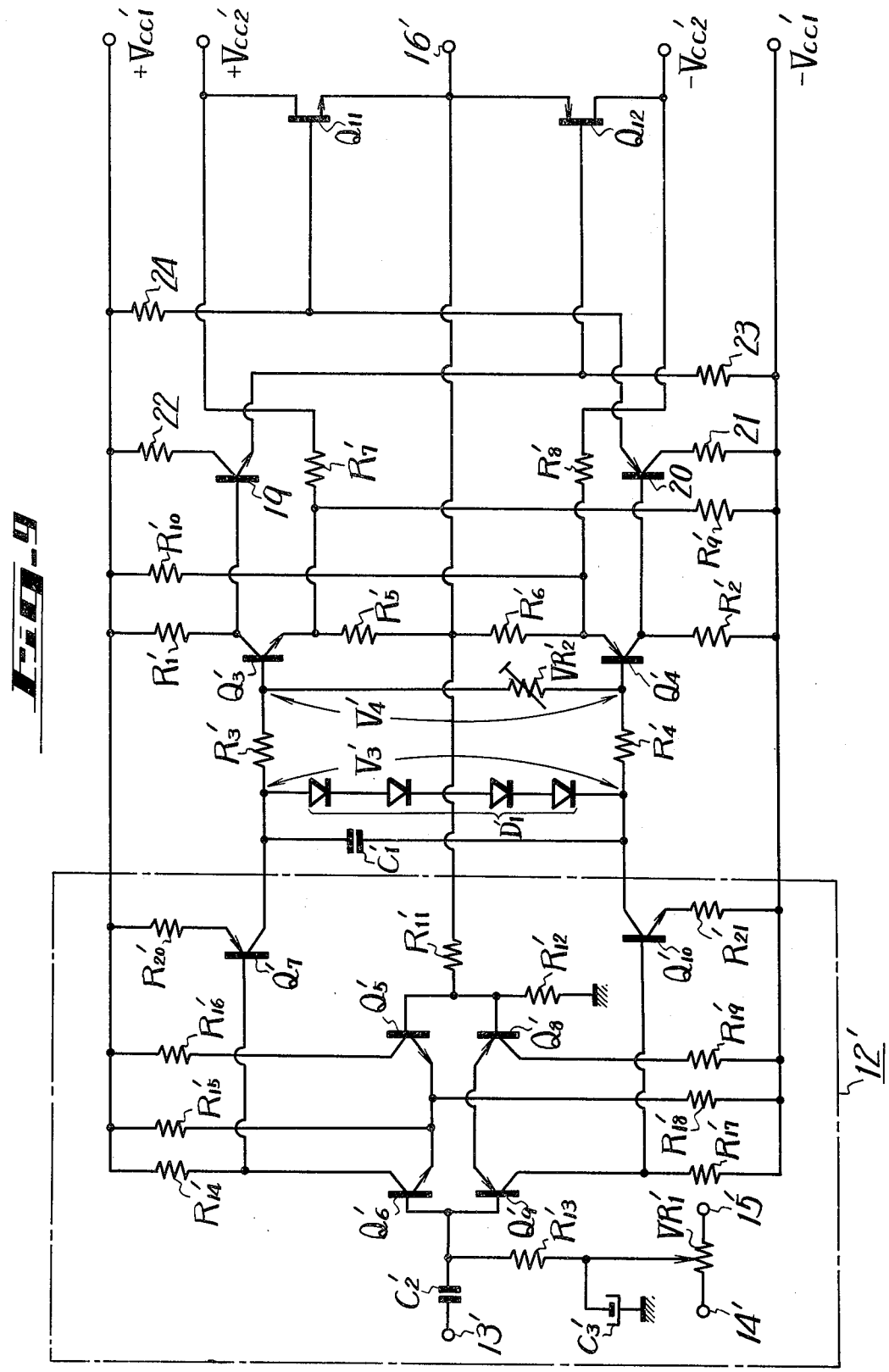
FIG. 9 is a schematic diagram of yet another embodiment of a transistor amplifier in accordance with the teachings of the present invention.

The amplifier of FIG. 9 is substantially similar to the previously described amplifier shown in FIG. 7, and corresponding component parts are identified by the previously adopted reference numerals, with the addition of a prime. The FIG. 9 embodiment differs from the FIG. 7 embodiment in that the transistor amplifier shown in FIG. 8 is used as the push-pull output amplifier. Also, whereas the FET's of the FIG. 7 embodiment are shown in common source configuration, the FIG. 9 embodiment utilizes FET's $Q_{11}$ and $Q_{12}$ in source-follower configuration.

The collector electrode of the transistor $Q'_3$ is coupled to the gate electrode of the FET $Q_{12}$ by an emitter follower transistor 19. It is apparent that the transistor $Q'_3$ and the FET $Q_{12}$ are of complementary conducting types, whereas the transistor $Q'_3$ and the emitter follower transistor 19 are of similar conductivity type. In the other push-pull stage, the collector electrode of the transistor $Q'_4$ is coupled to the gate electrode of the FET $Q_{11}$ by an emitter follower transistor 20. The transistor $Q'_4$ and the FET $Q_{11}$ are of complementary conductivity type, whereas the transistor $Q'_4$ and the emitter follower transistor 20 are of the same conductivity type.

The emitter follower transistor 19 is connected across the voltage sources $+V'_{cc1}$ and $-V'_{cc1}$, having its emitter electrode connected through a resistor 23 to the voltage source $-V'_{cc1}$ and its collector electrode connected through a resistor 22 to the source $+V'_{cc1}$. The emitter follower transistor 20 is symmetrically connected across these voltage sources through its emitter resistor 24 and its collector resistor 21.

The operation of the embodiment schematically depicted in FIG. 9 is substantially similar to the operation previously described with reference to FIG. 7 and, in addition, exhibits the improved higher frequency response characteristics which have been described with reference to the transistor amplifier of FIG. 8. Accordingly, in the interest of brevity, further description thereof need not be provided. However, it should be noted that since the FET's $Q_{11}$ and $Q_{12}$ are disposed in source follower configuration, the output impedance thereof is relatively low so as to provide a higher damping factor to the load impedance connected to the output terminal 16' than that provided by the common source configuration of FIG. 7. Nevertheless, the FET bias currents are seen to be stabilized even in the presence of fluctuations in the voltage sources $+V'_{cc1}$ and $-V'_{cc1}$, and/or fluctuations in the sources of operating potential $+V'_{cc2}$ and $-V'_{cc2}$.

While the present invention has been particularly shown and described with reference to a plurality of preferred embodiments thereof, it should be fully understood that various changes and modifications in form and details are contemplated. For example, the conductivity types of the respective transistors, as well as the FET's, can be suitably changed as desired. Also, the FET's may operate in other conventional classes of operation and need not be limited solely to the class-AB or -B modes of operation. Furthermore, if employed in push-pull configuration, it is appreciated that the amplifier stage 12 which drives the push-pull stage can be of other construction and need not be limited solely to the illustrated embodiments. Also, it is recognized that the particular applications for the teachings of the present invention admit of wide usage and need not be limited solely to audio amplifiers.

It is therefore intended that the appended claims be interpretated as including all such changes and modifications in form and details which may be made without departing from the spirit and scope of the present invention.

What is claimed is:

1. A transistor amplifier including a field effect transistor coupled to a load impedance, said field effect transistor having triode-type dynamic characteristics and having a stabilized DC bias current flowing therethrough notwithstanding fluctuations in a source of operating voltage coupled thereto, comprising: a transistor having an input electrode for receiving a signal and a pair of output electrodes; means for coupling one of said output electrodes to the gate electrode of said field effect transistor to apply a voltage thereto; means for injecting a portion of the fluctuations in said source of operating voltage into the other output electrode of said transistor to thereby vary the voltage applied to said field effect transistor gate electrode by said one output electrode of said transistor; and means for supplying a second operating voltage to said transistor.

2. A transistor amplifier in accordance with claim 1 wherein said transistor is a bipolar transistor, the emitter electrode of which is injected with said portion of fluctuations and the collector electrode of which is coupled to said field effect transistor gate electrode.

3. A transistor amplifier in accordance with claim 2 wherein said bipolar transistor and said field effect transistor are of complementary types.

4. A transistor amplifier in accordance with claim 2 wherein said second operating voltage is applied to said transistor through a first impedance connected to said collector electrode; and said means for injecting a portion of said first operating voltage fluctuations into said emitter electrode comprises a second impedance.

5. A transistor amplifier in accordance with claim 4 further comprising a third impedance for coupling said transistor emitter electrode to a reference potential.

6. A transistor amplifier in accordance with claim 5 wherein said first, second and third impedances comprise first, second and third resistors, respectively, having resistance values equal to $r_1$, $r_2$ and $r_3$, respectively, related in accordance with:

$$\frac{r_3}{r_2+r_3} \cdot \frac{r_1}{r_3} = 1 + \frac{1}{\mu}$$

where $\mu$ is the amplification constant of said field effect transistor.

7. A transistor amplifier in accordance with claim 4 wherein said first and second impedances are resistors having respective resistance values in a ratio that is substantially equal to $1 + 1/\mu$ where $\mu$ is the amplification constant of said field effect transistor.

8. A transistor amplifier in accordance with claim 3 wherein said field effect transistor is coupled to said load impedance in grounded source configuration.

9. A transistor amplifier in accordance with claim 3 wherein said field effect transistor is coupled to said load impedance in source-follower configuration.

10. A transistor amplifier in accordance with claim 1 wherein said means for coupling one of said transistor output electrodes to said field effect transistor gate electrode comprises an emitter-follower transistor.

11. A transistor amplifier in accordance with claim 1 wherein said field effect transistor and said transistor are included in one stage of a power amplifier for driving said load impedance, said power amplifier having a second, complementary stage comprising: a second field effect transistor having triode-type dynamic characteristics, said second field effect transistor being complementary to said first field effect transistor and having its source-drain circuit supplied with a further operating voltage; a second transistor complementary to said first transistor and having an input electrode for receiving a signal and a pair of output electrodes; means for coupling one of said second transistor output electrodes to the gate electrode of said second field effect transistor to apply a voltage thereto; means for injecting a portion of fluctuations in said further operating voltage into the other of said second transistor output electrodes to thereby vary the voltage applied to said gate electrode of said second field effect transistor by said one output electrode of said second transistor; and means for supplying a second further operating voltage to said second transistor.

12. A transistor amplifier in accordance with claim 11 further comprising additional means for injecting fluctuations in said second operating voltage and said second further operating voltage into said other of said second transistor output electrodes and into said other of said first transistor output electrodes, respectively, to thereby vary the voltages applied to said gate electrodes of said respective field effect transistors, whereby the DC bias currents flowing through said respective field effect transistors are maintained substantially constant notwithstanding fluctuations in said second operating voltage and said second further operating voltage.

13. A transistor amplifier in accordance with claim 12 wherein said addition means comprise respective resistors for injecting fluctuations in said second operating voltage into the emitter electrode of said second transistor and for injecting fluctuations in said second further operating voltage into the emitter electrode of said first transistor.

14. A transistor amplifier comprising a first voltage source having a pair of terminals; a second voltage source having a pair of terminals; first and second transistors, the collector electrode of said first transistor being connected to one terminal of said first voltage source through a first resistor, the collector electrode of said second transistor being connected to the other terminal of said first voltage source through a second resistor, the emitter electrodes of said first and second transistors being connected to each other through third and fourth resistors, respectively, and each base electrode of said first and second transistors being supplied with an input signal to be amplified; a first field effect transistor having triode-type dynamic characteristics and including a gate electrode connected to the collector electrode of said first transistor, and source and drain electrodes coupled between one terminal of said second voltage source and an output terminal; a second field effect transistor having triode-type dynamic characteristics and including a gate electrode connected to the collector electrode of said second transistor and source and drain electrodes coupled between the other terminal of said second voltage source and said output terminal; a fifth resistor connected between the one terminal of said second voltage source and the emitter electrode of said first transistor so as to supply a portion of voltage fluctuations of the second voltage source to said first transistor; and a sixth resistor connected between the other terminal of said second voltage source and the emitter electrode of said second transistor so as to supply a portion of voltage fluctuations of the second voltage source to said second transistor; whereby DC biasing currents flowing through the drain and source electrodes of said first and second field effect transistors are stabilized notwithstanding voltage fluctuations of said second voltage source.

15. A transistor amplifier in accordance with claim 14 wherein said first and second field effect transistors are connected in drain-follower configuration.

16. A transistor amplifier in accordance with claim 15 wherein said first transistor has NPN type conductivity and said second transistor has PNP type conductivity.

17. A transistor amplifier in accordance with claim 15 wherein the resistance values of said first through sixth resistors are equal to $r_1, r_2, r_3, r_4, r_5$ and $r_6$, respectively, the amplification constants of said first and second field effect transistors are equal to $\mu_1$ and $\mu_2$, respectively, and said resistance values have the relationship:

$$\frac{r_3}{r_5+r_3} \cdot \frac{r_1}{r_3} = 1 + \frac{1}{\mu_1}$$

$$\frac{r_4}{r_6+r_4} \cdot \frac{r_2}{r_4} = 1 + \frac{1}{\mu_2}.$$

18. A transistor amplifier in accordance with claim 15 wherein the resistance values of said first, second, fifth and sixth resistors are equal to $r_1, r_2, r_5$ and $r_6$, respectively, the amplification constant of said first and second field effect transistors are equal to $\mu_1$ and $\mu_2$, respectively, and said resistance values have the relationship:

$$\frac{r_1}{r_5} = 1 + \frac{1}{\mu_1}$$

$$\frac{r_2}{r_6} = 1 + \frac{1}{\mu_2}.$$

19. A transistor amplifier in accordance with claim 16 and further including a seventh resistor connected between the emitter electrode of said first transistor and the other terminal of said first voltage source; and an eighth resistor connected between the emitter electrode of said second transistor and said one terminal of said first voltage source; each of said seventh and eighth resistors supplying a portion of the voltage fluctuations of said first voltage source to said first and second transistors so as to stabilize the gate voltages of said first and second field effect transistors notwithstanding said first voltage source fluctuations.

20. A transistor amplifier in accordance with claim 19 wherein the resistance values of said first, second, third, fourth, seventh and eighth resistors are equal to $r_1, r_2, r_3, r_4, r_7$ and $r_8$, respectively, and said resistance values have the relationship:

$$\frac{r_3}{r_7+r_3} \cdot \frac{r_1}{r_3} = 1$$

$$\frac{r_4}{r_8+r_4} \cdot \frac{r_2}{r_4} = 1.$$

21. A transistor amplifier in accordance with claim 19 wherein the resistance value of said first resistor is substantially equal to the resistance value of said seventh resistor; and the resistance value of said second resistor is substantially equal to the resistance value of said eighth resistor.

22. A transistor amplifier comprising a first voltage source having a pair of terminals; a second voltage source having a pair of terminals; first and second transistors, the collector electrode of said first transistor being connected to one terminal of said first voltage source through a first resistor, the collector electrode of said second transistor being connected to the other terminal of said first voltage source through a second resistor, the emitter electrodes of said first and second transistors being connected to each other through third and fourth resistors, respectively, and each base electrode of said first and second transistors being supplied with an input signal to be amplified; a first field effect transistor having triode-type dynamic characteristics and including a gate electrode, and source and drain electrodes coupled between one terminal of said second voltage source and an output terminal; a second field effect transistor having triode-type dynamic characteristics and including a gate electrode, and source and drain electrodes coupled between the other terminal of said second voltage source and said output terminal; a fifth resistor connected between the one terminal of said second voltage source and the emitter electrode of said first transistor so as to supply a portion of voltage fluctuations of the second voltage source to said first transistor; a sixth resistor connected between the other terminal of said second voltage source and the emitter electrode of said second transistor so as to supply a portion of voltage fluctuations of the second voltage source to said second transistor; a first emitter follower amplifier for coupling the collector electrode of said first transistor to the gate electrode of said second field effect transistor; and a second emitter follower amplifier for coupling the collector electrode of said second transistor to the gate electrode of said first field effect transistor; whereby DC biasing currents flowing through the drain and source electrodes of said first and second field effect transistors are stabilized notwithstanding voltage fluctuations of said second voltage source.

23. A transistor amplifier comprising: first and second voltage sources each having a pair of terminals; first and second transistors, the collector electrode of said first transistor being connected to one terminal of said first voltage source through a first resistor, the collector electrode of said second transistor being connected to the other terminal of said first voltage source through a second resistor, the emitter electrodes of said first and second transistors being connected to each other through third and fourth resistors, respectively, and the base electrodes of said first and second transistors being supplied with an input signal to be amplified; a third transistor having its base electrode connected to the collector electrode of said first transistor, its collector electrode connected to said one terminal of said first voltage source, and its emitter electrode connected to the other terminal of said first voltage source through a fifth resistor; a fourth transistor having its base electrode connected to the collector electrode of said second transistor, its collector electrode connected to the other terminal of said first voltage source, and its emitter electrode connected to said one terminal of said first voltage source through a sixth resistor; a first field effect transistor having triode-type dynamic characteristics and having its gate electrode connected to the emitter electrode of said fourth transistor, and its drain and source electrodes connected between one terminal of said second voltage source and an output terminal; a second field effect transistor having triode-type dynamic characteristics and having its gate electrode connected to the emitter electrode of said third transistor, and its drain and source electrodes connected between the other terminal of said second voltage source and the output terminal; a seventh resistor connected between the one terminal of said second voltage source and the emitter electrode of said first transistor to supply a portion of voltage fluctuations of the second voltage source to said first transistor; an eighth resistor connected between the other terminal of said second voltage source and the emitter electrode of said second transistor to supply a portion of the voltage fluctuations of said second voltage source to said second transistor; whereby DC biasing currents flowing through the drain and source electrodes of said first and second field effect transistors are stabilized notwithstanding voltage fluctuations of said second voltage source.

24. A transistor amplifier in accordance with claim 23 wherein each of said first and third transistors is of NPN type conductivity, and each of said second and fourth transistors is of PNP type conductivity.

25. A transistor amplifier in accordance with claim 23 wherein the resistance values of said first, second, third, fourth, seventh and eighth resistors are equal to $r_1$, $r_2$, $r_3$, $r_4$, $r_7$ and $r_8$, respectively, the amplification constants of said first and second field effect transistors are equal to $\mu_1$ and $\mu_2$, respectively, and said resistance values have the relationship:

$$\frac{r_3}{r_7+r_3} \cdot \frac{r_1}{r_3} = 1 + \frac{1}{\mu_1}$$

$$\frac{r_4}{r_8+r_4} \cdot \frac{r_2}{r_4} = 1 + \frac{1}{\mu_2}.$$

26. A transistor amplifier in accordance with claim 23 wherein the resistance values of said first, second, seventh and eighth resistors are equal to $r_1$, $r_2$, $r_7$ and $r_8$, respectively, the amplification constants of said first and second field effect transistors are equal to $\mu_1$ and $\mu_2$, respectively, and said resistance values have the relationship:

$$\frac{r_1}{r_7} \simeq 1 + \frac{1}{\mu_1}$$

$$\frac{r_2}{r_8} \simeq 1 + \frac{1}{\mu_2}.$$

27. A transistor amplifier in accordance with claim 23 and including a ninth resistor connected between the emitter electrode of said first transistor and the other terminal of said first voltage source; a tenth resistor connected between the emitter electrode of said second transistor and said one terminal of said first voltage source; said ninth and tenth resistors supplying a portion of the voltage fluctuations of said first voltage source to said first and second transistor emitter electrodes so as to stabilize the collector voltages of said first and second transistors notwithstanding said first voltage source fluctuations.

28. A transistor amplifier in accordance with claim 27 wherein the resistance values of said first, second, third, fourth, ninth and tenth resistors are equal to $r_1$, $r_2$, $r_3$, $r_4$, $r_9$ and $r_{10}$, respectively, and said resistance values have the relationship:

$$\frac{r_3}{r_9+r_3} \cdot \frac{r_1}{r_3} = 1$$

$$\frac{r_4}{r_{10}+r_4} \cdot \frac{r_2}{r_4} = 1.$$

29. A transistor amplifier in accordance with claim 27 wherein the resistance value of said first resistor is substantially equal to the resistance value of said ninth resistor, and the resistance value of said second resistor is substantially equal to the resistance value of said tenth resistor.

* * * * *